United States Patent [19]

Mori et al.

[11] 3,911,268

[45] Oct. 7, 1975

[54] PHOTODIODE BIASING CIRCUIT

[75] Inventors: Chiharu Mori, Tokyo; Masahiro Kawasaki, Shimuranishidai, both of Japan

[73] Assignee: Asahi Kogaku Kogyo Kabushiki Kaisha, Japan

[22] Filed: June 27, 1974

[21] Appl. No.: 483,710

[30] Foreign Application Priority Data

July 6, 1973 Japan ................................ 48-79757

[52] U.S. Cl. ............ 250/206; 250/214 R; 307/304; 307/311

[51] Int. Cl.[2] ........................................ H01J 39/12

[58] Field of Search .......... 307/311, 304; 250/211 J, 250/212, 206, 214 R

[56] References Cited

UNITED STATES PATENTS

| | | | |
|---|---|---|---|
| 3,518,438 | 6/1970 | Hart et al. | 250/212 X |
| 3,601,712 | 8/1971 | Elazar | 307/304 X |
| 3,639,787 | 2/1972 | Lee | 307/304 X |
| 3,770,968 | 11/1973 | Hession | 250/214 R |
| 3,780,321 | 12/1973 | Lentz | 307/304 |
| 3,784,844 | 1/1974 | McGrogan, Jr. | 307/311 X |

*Primary Examiner*—Walter Stolwein
*Attorney, Agent, or Firm*—Steinberg & Blake

[57] ABSTRACT

A biasing circuit for a photodiode including a source follower circuit with a field effect transistor having its gate and source terminals adapted to be coupled across the photodiode. A transistor is serially connected to the source of the FET for providing a constant current to the FET. A control circuit including a diode is connected between the base and emitter of the transistor for providing a bias thereto. A constant current circuit including a self-biased field effect transistor is serially coupled to the diode. The self-biased FET produces a constant current flowing through the diode, which in turn produces a constant current through the transistor. The current through the transistor causes a voltage drop which is equal and opposite that of the gate to source voltage of the FET, whereby there is provided an effective short circuit across the photodiode.

14 Claims, 2 Drawing Figures

PHOTODIODE BIASING CIRCUIT

BACKGROUND OF THE INVENTION

The present invention relates to a biasing circuit.

In particular, the present invention relates to a biasing circuit for a photosensitive device such as a PN junction type light receiving element, generallyknown as a photodiode.

Photosensitive means are commonly used for measuring light. The photosensitive means produces a photocurrent the magnitude of which is indicative of the magnitude of the illumination received by the photosensitive means. One type of photosensitive means which is commonly used is a PN junction type light receiving element, such as for example a solar battery which has a photoelectric effect. Such photosensitive devices are generally referred to as photodiodes. The photodiode is generally operated in a reverse bias condition. Bias circuits are therefore utilized in conjunction with the photodiode to provide the required reverse bias so that the photodiode can develop an output current which is proportional to the amount of illumination received on the light receiving surface of the photodiode. The photodiode acts as a constant current source producing an output current whose value is proportional to the illumination on the light receiving surface of the photodiode. When the amount of illumination becomes very low, as for example in the order of 0.01 lux, the influence of the dark current becomes significant and the output current produced by the photodiode is no longer proportional to the magnitude of the illumination received on the light receiving surface of the photodiode. In order to eliminate the effect of the dark current, there is generally provided a circuit for use with the photodiode which provides an effective short circuit across the photodiode. One such arrangement utilizes two serially connected field effect transistors wherein one serves as a source follower and the other provides a constant current source to the source follower FET. A transistor emitter follower interconnects the source electrode of the source follower FET with one end of the photodiode, while the gate of the source follower FET is coupled to the other end of the photodiode.

A transistor emitter follower interconnects the source electrode of the source follower FET with one end of the photodiode, while the gate of the source follower FET is coupled to the other end of the photodiode.

While such circuit arrangements do provide the effective short circuit across the photodiode, since it is necessary that two FETs be serially connected, the power source voltage cannot be easily reduced. In order to operate with a low power voltage, it is necessary that the FETs have a low pinch-off voltage which is generally difficult to obtain. Furthermore, such circuit arrangements are subject to temperature influences, since the temperature characteristics of the source follower FET and the emitter follower transistor are quite different.

SUMMARY OF THE INVENTION

It is accordingly a primary object of the present invention to provide a photodiode biasing circuit which will avoid the above drawbacks.

In particular, it is an object of the present invention to provide a biasing circuit which is highly stabilized against temperature variations and power voltage variations.

Also, it is an object of the present invention to provide a biasing circuit which is essentially free from requirements that circuit components, including field effect transistors and regular transistors, have specified characteristics.

A further object of the present invention is to provide a biasing circuit which permits reduction in power consumption.

Thus, it is an object of the present invention to provide a biasing circuit of the above type which is far more stable than previously known similar circuits, while at the same time permitting a photodiode to have an extremely extended photometric range with a fast response time.

According to the invention, the biasing circuit for a photodiode includes a source follower circuit means having a field effect transistor means with its gate and source terminals adapted to be connected across the photodiode. The source follower circuit means also includes a transistor means serially coupled to the source of the FET means for providing a constant voltage to the FET means. A control circuit means includes diode means connected between the base and emitter of the transistor means and provides a bias to the transistor means. A constant current circuit means includes a self-biased FET means which is serially coupled to the diode means and provides a constant current to the diode means.

In a specific embodiment of the invention, the diode is formed by utilizing a biasing transistor having its base and collector terminals interconnected. The biasing transistor and the transistor means having characteristics which are substantially equal. The characteristics of the FET means and the self-biased FET means are also substantially equal. First and second resistors are respectively included in series between the self-biased FET and the biasing transistor on the one hand, and the FET means and the transistor means on the other hand. The resistances of the two resistors are also substantially equal. In this manner the current developed by the transistor means is such that the voltage across the second resistor will be equal and opposite to gate to source voltage of the FET means to thereby provide an effective short circuit across the photodiode.

BRIEF DESCRIPTION OF THE DRAWINGS

The invention is illustrated by way of example in the accompanying drawings which form part of this application and in which.

DESCRIPTION OF THE PREFERRED EMBODIMENT

Figure 1:
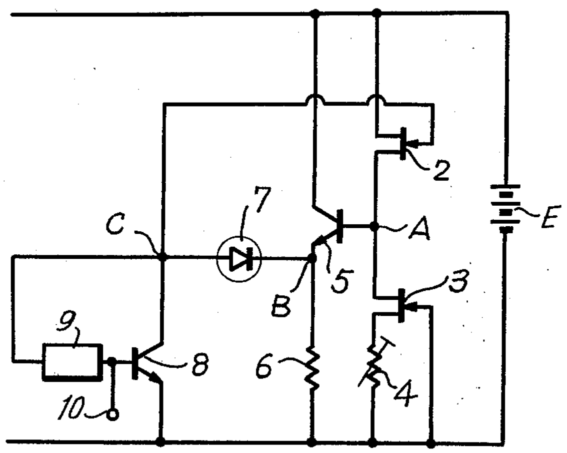
FIG - 1 PRIOR ART
FIG. 1 is a circuit diagram of a biasing circuit for a photodiode according to conventional techniques.

Referring now to FIG. 1 there is shown a conventional biasing circuit for providing an effective short circuit across a photodiode. The biasing circuit includes a field effect transistor 2 connected as a source follower. A second field effect transistor 3 is connected in series with the first FET 2. A voltage source E isconnected across the series combination of the two FETs. The gate of FET 3 is connected to the negative terminal of the voltage source, which typically represents a ground connection. Field effect transistor 3, together with variable resistor 4 connected to one of its terminals, serves as a constant current source to provide a constant current through the source-drain of field effect transistor 2. Connected to the point A, representing the interconnection between the two field effect transistors, is an emitter follower circuit including transistor 5 and resistor 6 connected to the emitter of transistor 5 at the point B. Photodiode 7 is connected with its cathode coupled to the emitter of transistor 5, at point B, and its anode coupled to the gate of FET 2 at point C. In series with the photodiode is a transistor 8 having its collector connected at the point C and its emitter connected to ground. A self-biasing arrangement 9 interconnects the base and collector of transistor 8. Transistor 8 provides a logarithmic compression of the current developed in the photodiode 7 which represents the magnitude of the illumination received by the photodiode. The output voltage is taken at point 10 at the base of transistor 8.

With the circuit arrangement of FIG. 1, the resistance of the variable resistor 4 is set such that the gate-source voltage ($V_{GS}$) of the source follower FET 2 is equal and opposite to the base emitter voltage ($V_{BE}$) of transistor 5 included in the emitter follower circuit connected to the source terminal of FET 2. With these values, $VB = V_C$ so that the voltage developed across the terminals of the photodiode 7 becomes zero and accordingly there is developed a biasing condition across the photodiode which provides an effective short circuit across the photodiode. It is assumed, that the photoelectric current flowing through the photodiode is small compared with the emitter current of transistor 5.

The conventional biasing circuit shown in FIG. 1, however, is affected by the specific characteristics of the FETs themselves and is also susceptible to temperature changes and voltage changes due to the circuit arrangement. Since the FETs 2 and 3 are connected in series and the power source E is connected across both of them, it is not easy to reduce the power voltage. In order to operate with a low voltage, it is necessary that the characteristics of the FETs are such that they have a low pinch-off voltage. However, it is considerably difficult to obtain FETs with such characteristics. Additionally, the zero voltage across the photodiode is obtained by the addition of the gate-source voltage of FET 2 and the base-emitter voltage of transistor 5. However, the temperature characteristics of an FET and a transistor are quite different, such that a temperature variation will cause different changes in the respective voltages of the FET 2 and the transistor 5 and the biasing conditions across photodiode 7 will be adversely affected.

Figure 2:
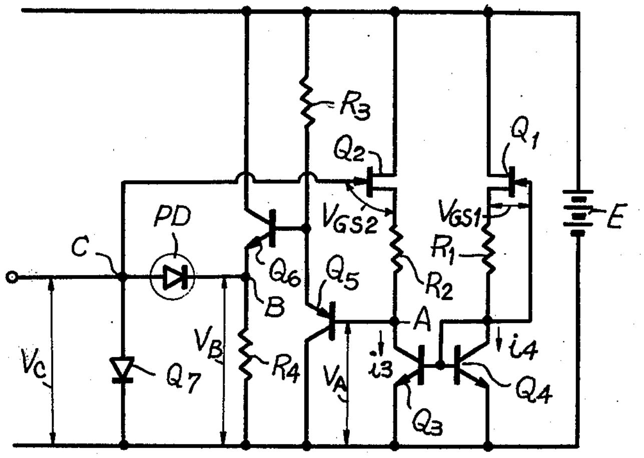
FIG. 2 is a circuit diagram of the biasing circuit for a photodiode according to an embodiment of the present invention.

Referring now to FIG. 2 there is shown a circuit diagram in accordance with the present invention, which avoids the restrictions and sensitivities of prior circuit arrangements and which is not affected by temperature changes and power voltage changes. In FIG. 2, a source follower circuit is formed with field effect transistor Q2. Transistor Q3 is serially connected to the source terminal of FET Q2 for providing a constant current thereto. The source terminal of FET Q2 is shown interconnected with the collector of transistor Q3 by means of a resistor R2. A control circuit provides a bias for the transistor Q3 and includes a diode connected across the base and emitter terminals of the transistor Q3. The diode is formed by means of a biasing transistor Q4 having its base and collector terminals interconnected. A self-biased field effect transistor Q1 is connected in series with the transistor Q4 to control the current flowing therethrough. A resistor R1 is interconnected between the source terminal of FET Q1 and the collector of transistor Q4. A voltage source E is connected across the series combination formed by the source follower circuit including the FET Q2, the resistor R2 and the transistor Q3. The photodiode PD, which is being biased, is interconnected across the gate and source terminals of the source follower FET Q2. The anode of the photodiode is connected directly to the gate at point C. The cathode could be connected directly to the source, through the resistor R2, at the point A. Alternately, a buffer circuit is interconnected between the source of the FET Q2 and the photodiode. The buffer circuit is shown to include two complementary emitter follower circuits connected in tandem arrangement. A first emitter follower circuit includes transistor Q5 having its base coupled to point A and including a resistor R3 in its emitter circuit. A second emitter follower circuit includes transistor Q6 having its base coupled to the first emitter follower circuit and includes a resistor R4 coupled in its emitter circuit. Transistor Q5 is shown as a PNP type transistor, while transistor Q6 is shown as a NPN type transistor. The photodiode is coupled to the emitter of transistor Q6 at point B. A diode Q7 is shown connected in series with the photodiode PD to provide a logarithmic compression of the photocurrent which the photodiode produces and which is a function of the magnitude of the illumination received by the photodiode.

The characteristics of the transistors Q3 and Q4 are substantially equal. Similarly, the FETs Q1 and Q2 are also made with substantially equal characteristics. This can be achieved by forming the FETs on the same substrate and providing a pair of FETs as is known in the art. Additionally, the resistances of resistors R1 and R2 are also substantially equal.

The operation of the biasing circuit shown in FIG. 2 will now be described. If the gate-source voltage of the self-biased FET Q1 is represented by $V_{GS1}$, and the resistance of the self-biasing resistor $R_1$ is represented by $r_1$, than the source current $i_4$ which also flows through the transistor $Q_4$ will be expressed as follows:

$$i_4 = \frac{V_{GS1}}{r_1} \qquad (1)$$

Since the transistor Q4 and transistor Q3 have equal characteristics, if $i_4$ represents the collector current flowing in the diode connected transistor Q4, and the collector current flowing through the transitor $Q_3$ is represented by $i_3$, then the following relationship will exist:

$$i_3 = i_4 \qquad (2)$$

If the gate-source voltage of FET Q2 is represented by $V_{GS2}$ then the relationship between the gate voltage $V_C$ of FET Q2 and the collector voltage $V_A$ of the transistor $Q_3$ is expressed as follows:

$$V_C - V_A = i_3 r_2 - V_{GS2} \quad (3)$$

wherein $r_2$ is the resistance of $R_2$. Since the resistors R1 and R2 are selected to be substantially equal to each other, then their resistances are also substantially equal and $i_3r_2$ will be equal to $i_4r_1$, which from equation (1) is equal to $V_{GS1}$. Therefore, equation (3) can be rewritten as follows:

$$V_C - V_A = V_{GS1} - V_{GS2} \quad (4)$$

Since the characteristics of the FETs are substantially equal, than $V_{GS1}$ will be equal to $V_{GS2}$ whereby:

$$V_C - V_A = 0 \quad (5)$$

This last equation indicates that the potential at point A equals the potential at point C. If the photodiode were therefore interconnected between points C and A, there would be established an effective short circuit across the photodiode. However, a buffer circuit can also be included between the point A and the photodiode. The buffer circuit would include the transistors $Q_5$ and $Q_6$ as is shown in FIG. 2. If the base-emitter voltages of transistors $Q_5$ and $Q_6$ are represented respectively by $V_{BE5}$ and $V_{BE6}$, then the cathode voltage $V_B$ at the photodiode can be expressed as follows:

$$V_B = VA + V_{BE5} - V_{BE6} \quad (6)$$

If the transistors Q5 and Q6 are substantially the same, then the voltage $V_{BE5}$ nearly equals $V_{BE6}$ and then:

$$V_B = V_A \quad (7)$$

Combining equations 5 and 7 there is obtained the following:

$$V_B = V_C = V_A \quad (8)$$

Therefore, the voltage across the terminals B and C of the photodiode is set to zero which provides the effective short circuit across the photodiode.

With the circuit arrangement as shown in FIG. 2, since the drain-source voltages of the FETs Q1 and Q2 are substantially equal to each other, their absolute values can be selected to be large enough to provide a reduced voltage characteristic. Furthermore, the internal characteristic parameters of the individual FETs Q1 and Q2 are not of any significance since their absolute values do not play any particular part in the circuit, but it is rather that they are substantially equal which is of importance. It is relatively easy to obtain a pair of FETs with substantially equal characteristics and wherein their particular absolute values are of no significance. In addition, the circuit arrangement is such that each semiconductive device is compensated by a substantially identical semiconductive device having substantially the same temperature dependency. Thus, FET Q1 is compensated by FET Q2; transistor Q3 is compensated by transistor Q4, and transistor Q5 is compensated by transistor Q6. There is thus eliminated the combining effect of an FET with a regular transistor as in the conventional circuit arrangement. Furthermore, by suitably setting the resistors R1 and R2, the bias voltage of FETs Q1 and Q2 can be set as desired. This permits a reduction in the power consumption of the circuit.

The photocurrent developed by the photodiode PD flows into the logarithmic conversion element Q7 and develops across the terminals of the diode Q7 an output voltage $V_C$ which is proportional to the logarithm of the photoelectric current, which in turn is proportional to the magnitude of the illumination received by the photodiode. The present invention therefore provides an effective zero biasing condition across the photodiode and permits the photodiode to be used over an extremely extended photometric range and provide fast response.

What is claimed is:

1. In a circuit having a photodiode to be biased, source follower circuit means including source follower FET means having gate and source terminals between which the photodiode is electrically connected, transistor means serially coupled to the source of said FET means for providing a constant current to said FET means, control circuit means including diode means connected between the base and emitter of said transistor means for providing a bias to said transistor means, and constant current means including a self-biased FET means serially coupled to said diode means.

2. The combination if claim 1 and wherein said diode means includes a biasing transistor having its base and collector terminals interconnected, and wherein the characteristics of said transistor means and said biasing transistor are substantially equal and the characteristics of said source follower FET means and said self-biased FET means are also substantially equal.

3. The combination of claim 2 and further including first resistor means serially interconnected between the source of said self-biased FET means and said diode means, and second resistor means having a resistance substantially equal to that of said first resistor means and serially interconnected between the source of said source follower FET means and said transistor means.

4. The combination of claim 3 and wherein said transistor means has its collector terminal connected to said second resistor means.

5. The combination of claim 1 and further including buffer circuit means coupled between the source of said source follower FET means and said photodiode.

6. The combination of claim 5 and wherein said buffer circuit means includes first and second complementary source follower circuit arrangements coupled in tandem relationship and having substantially equal base-emitter voltages.

7. The combination of claim 6 and wherein said first source follower circuit arrangement includes a PNP type transistor having its base coupled to the source of said source follower FET means and first emitter resistor coupled to the emitter of said PNP transistor, said second source follower circuit arrangement includes an NPN transistor having its base coupled to the emitter of said PNP transistor and a second emitter resistor coupled to the emitter of said NPN transistor, the emitter of said NPN transistor being coupled to said photodiode.

8. The combination of claim 1 and further including voltage source means coupled across said series connection of said source follower FET means and said transistor means.

9. The combination of claim 1 and wherein said photodiode has an anode coupled to the gate of said source follower FET means and a cathode coupled to the source of said FET means.

10. The combination of claim 9 and further comprising logarithmic compression means electrically connected to said photodiode for receiving photocurrent therefrom and providing a logarithmically compressed output in the form of a voltage, the magnitude of which is indicative of the magnitude of the illumination received by said photodiode.

11. In a light measuring circuit, photosensitive means for providing, when receiving light, a photocurrent the magnitude of which is indicative of the magnitude of the illumination received by said photosensitive means, source follower circuit means including source follower FET means having its gate coupled to one side of said photosensitive means, source resistor means having one end thereof coupled to the source of said FET means and the other end thereof coupled to the other side of said photosensitive means, transistor means having its collector-emitter path serially coupled to the other end of said resistor means, and biasing circuit means coupled to the base of said transistor means for producing in said transistor means a constant current such that the voltage across said resistor means is equal and opposite to the gate-source voltage of said FET means.

12. The combination of claim 11 and wherein said biasing circuit means further includes diode means coupled to the base of said transistor means and a self-biased FET serially coupled to said diode means.

13. The combination of claim 12 and wherein the collector of said transistor means is coupled to said resistor means and wherein said diode means is coupled between the base and emitter of said transistor means.

14. The combination of claim 12 and wherein said diode means is formed by a biasing transistor having its base and collector terminals interconnected and wherein the characteristics of said transistor means and said biasing transistor are substantially equal, the characteristics of said source follower FET means and said self-biased FET being substantially equal, and further including additional resistor means having a resistance substantially equal to that of said source resistor means and coupled between said diode means and said self-biased FET.

* * * * *